United States Patent
Chuang

(10) Patent No.: US 6,774,002 B2
(45) Date of Patent: Aug. 10, 2004

(54) STRUCTURE AND METHOD FOR FORMING SELF-ALIGNED BIPOLAR JUNCTION TRANSISTOR WITH EXPITAXY BASE

(75) Inventor: Shu-Ya Chuang, Hsin-Chu (TW)

(73) Assignee: United Microelectronics Corp., Hsin-chu (TW)

(*) Notice: Subject to any disclaimer, the term of this patent is extended or adjusted under 35 U.S.C. 154(b) by 0 days.

(21) Appl. No.: 10/279,549

(22) Filed: Oct. 23, 2002

(65) Prior Publication Data

US 2004/0082135 A1 Apr. 29, 2004

(51) Int. Cl.$^7$ ............................................. H01L 21/331
(52) U.S. Cl. ....................... 438/343; 438/364; 438/365; 438/366; 257/197
(58) Field of Search ................... 438/361–364, 438/365, 366, 343; 257/197, 585–588

(56) References Cited

U.S. PATENT DOCUMENTS 6,509,242 B2 * 1/2003 Frei et al. .................... 438/312
2003/0057458 A1 * 3/2003 Freeman et al. ............. 438/312

* cited by examiner

Primary Examiner—Dung A Le
(74) Attorney, Agent, or Firm—Merchant & Gould P.C.

(57) ABSTRACT

The present invention proposes a novel method to fabricate a Bipolar Junction Transistor device. The steps of the present invention include forming a shallow trench isolation structure in a substrate. An oxide layer is formed on the substrate. Subsequently, a polysilicon layer is next formed on the oxide layer, and the polysilicon layer has first type ion. Successively, a polysilicon layer is patterned on the oxide layer. The next step is to perform a second type ion implantation, thereby forming a collector region in the substrate and below the emitter window. The oxide layer is removed inside the emitter window. An expitaxy base is then formed on the polysilicon layer and substrate, thereby forming base region on the collector region, wherein the expitaxy base has the first type ion. After the expitaxy base is formed, a dielectric layer is formed over the expitaxy base. Next, the dielectric layer is etched to form inner spacer on sidewalls of the expitaxy base inside the emitter window. A second polysilicon layer is formed over the expitaxy base and the emitter window, wherein the second polysilicon layer has the second type ion. Finally, an etching process is introduced to etch the second polysilicon layer to form emitter plug. That is self-aligned to the emitter window.

36 Claims, 4 Drawing Sheets

STRUCTURE AND METHOD FOR FORMING SELF-ALIGNED BIPOLAR JUNCTION TRANSISTOR WITH EXPITAXY BASE

BACKGROUND OF THE INVENTION

1. Field of the Invention

The present invention relates to a Bipolar Junction Transistor device, and more specifically, to a method of fabricating self-aligned Bipolar Junction Transistor with expitaxy base.

2. Description of the Prior Art

Bipolar Junction Transistor (BJT) is a transistor device using electrons and holes carrier to transport currents. Bipolar Junction Transistor has three electrodes, emitter, base and collector. The function of the Bipolar Junction Transistor is to enlarge a input current signal, and therefore the Bipolar Junction Transistor can be transferring current amplifier of voltage signal.

The speed of the Bipolar Junction Transistor is faster than MOSFET. Nevertheless, operating dissipation energy of the Bipolar Junction Transistor is higher than the MOSFET, and dissipation heat removal is a barrier for the Bipolar Junction Transistor application in devices integration increasing. In some special application, the Bipolar Junction Transistor is still needed. Moreover, an applied product is combined CMOS with BJT to form BiCMOS device. The BiCMOS device is formed through considering the advantage of faster speed of BJT and lower dissipation energy of CMOS.

The BiCMOS device includes BJT and CMOS these two structures, wherein the BJT device is formed to provide high speed and high current driving in a circuit and CMOS device is formed to provide high integration and low dissipation energy in the circuit. Therefore, the BiCMOS device can provide many good functions, for example, higher speed, lower noise and low power.

Besides, a newer BJT application device is Hetro-junction Bipolar Transistor (HBT). The HBT device is formed using GaAs material, and it can apply to microwave. The emitter, base, and collector configuration of the HBT is arranged vertically, and the electric current in channel is also in vertical direction. The structure characteristic can reach extremely power density. That is, in the same output power, the die size of HBT can be permitted smaller, and operated in single power source.

Furthermore, the HBT have preferable properties in linear response and power efficiency, and therefore, the HBT has become a key device for mobile phone and personal communication service.

The BJT and HBT device have become more popular and have been widely used. However, traditional fabricating method of BJT has some drawbacks; for example, extrinsic base resistance (Rbb') is still affected by expitaxy polysilicon thickness variation on oxide/SiN. Moreover, self-aligned collector implant (SIC) will be implanted through expitaxy film, and this will degrade the expitaxy film quality. If the collector implant is performed before formation of expitaxy film, CB (collector/base) junction will be too high to reduce the speed of electrons and holes carrier.

For advanced generation BJT making process, the emitter window width is not enough for CD/AA margin. For these reasons, it is desired to find a BJT making method to solve above issues.

SUMMARY OF THE INVENTION

Owing to traditional formation of BJT's drawbacks in the prior art, the present invention discloses a method of fabricating self-aligned Bipolar Junction Transistor with expitaxy base.

The steps of the present invention include forming a shallow trench isolation structure in a substrate. An oxide layer is formed on the substrate. Subsequently, a polysilicon layer is next formed on the oxide layer, and the polysilicon layer has first type ion. Successively, a polysilicon layer is patterned on the oxide layer. The next step is to perform a second type ion implantation, thereby forming a collector region in the substrate and below the emitter window. The oxide layer is removed inside the emitter window. An expitaxy base is then formed on the polysilicon layer and substrate, thereby forming base region on the collector region, wherein the expitaxy base has the first type ion. After the expitaxy base is formed, a dielectric layer is formed over the expitaxy base. Next, the dielectric layer is etched to form inner spacer on sidewalls of the expitaxy base inside the emitter window. A second polysilicon layer is formed over the expitaxy base and the emitter window, wherein the second polysilicon layer has the second type ion. Finally, an etching process is introduced to etch the second polysilicon layer to form emitter plug. That is self-aligned to the emitter window.

BRIEF DESCRIPTION OF THE DRAWINGS

The foregoing aspects and many of the attendant advantages of this invention will become more readily appreciated as the same becomes better understood by reference to the following detailed descriptions, when taken in conjunction with the accompanying drawings, wherein.

DESCRIPTION OF THE PREFERRED EMBODIMENT

The present invention proposes a novel method to fabricate a Bipolar Junction Transistor device. The aspect of the present invention proposes a novel method for forming self-aligned Bipolar Junction Transistor with expitaxy base. The detail description of the method will be seen as follows.

Figure 1:
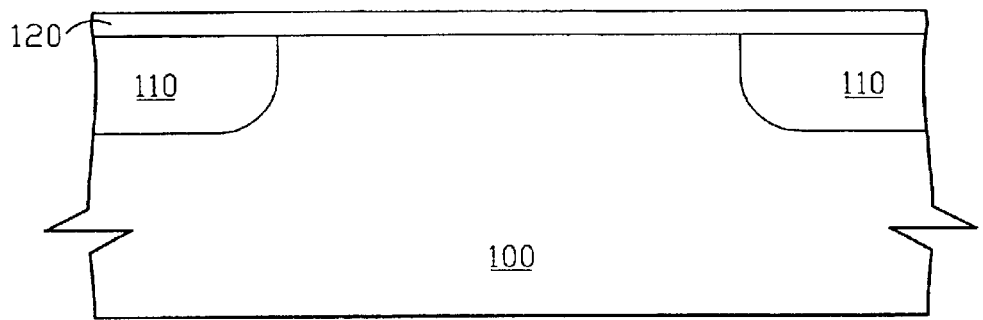
FIG. 1 is the cross sectional view of forming oxide layer on substrate according to the present invention.

Turning to FIG. 1, it shows the cross sectional view according to the present invention. The first procedure of the present invention is to form the STI (shallow trench isolation) 110 on the substrate 100 for isolation. Subsequently, an oxide layer 120 is formed on the substrate 100 to a thickness of about 50 to 500 angstroms. Any suitable process can be used for depositing the oxide layer 120. For example, chemical vapor deposition (CVD) may be used. Next, a polysilicon layer 130 is formed on the oxide layer 120.

Figure 2:
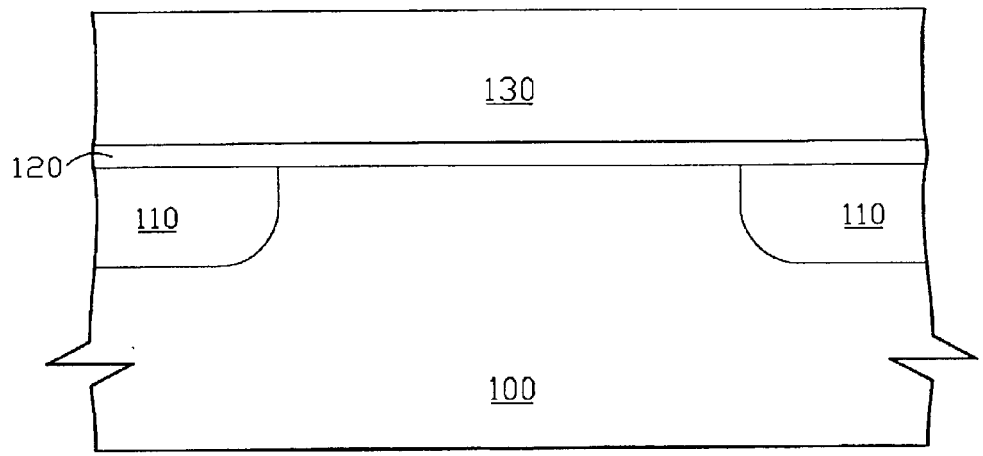
FIG. 2 is the cross sectional view of forming polysilicon on the oxide layer according to the present invention.

In the preferred embodiment, the polysilicon or amorphous-Si layer 130 can be formed by using a chemical vapor deposition process with a SiH4 source. Next, a blanket ion implantation with conductive dopants is doped into the polysilicon layer 130. Preferably, the polysilicon layer 130 is formed of in-situ doped polysilicon, because formed in-situ doped polysilicon can reduce the polysilicon layer 130 electric resistance. Furthermore, the polysilicon layer 130 has as the same type conductive dopant with a base dopant type of the Bipolar Junction Transistor, for example, n-type conductive dopant or p-type conductive dopant. The polysilicon layer 130 thickness is about 2000 to 4000 angstroms, as shown in FIG. 2.

Figure 3:
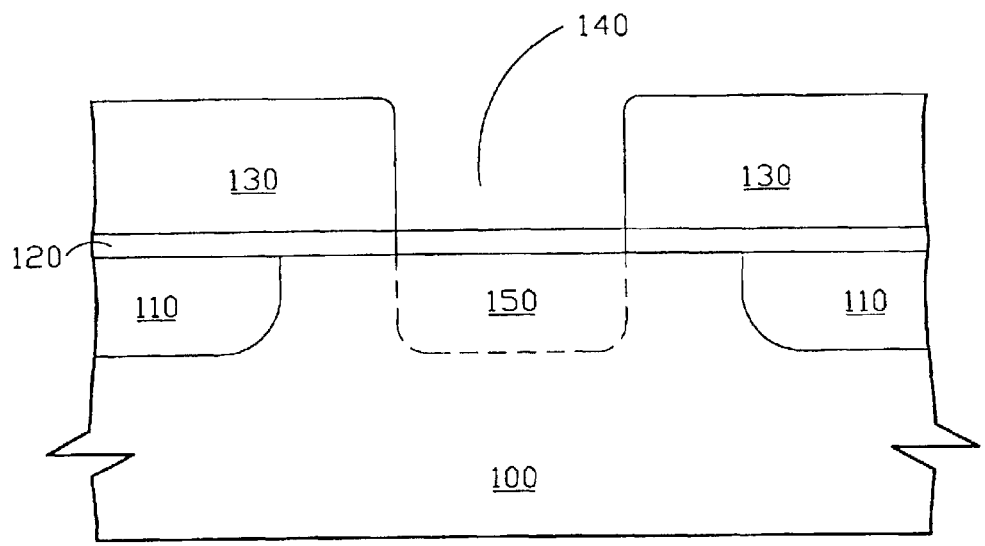
FIG. 3 is the cross sectional view of forming emitter window on the substrate according to the present invention.

Turning to FIG. 3, it shows the cross sectional view of forming emitter window in substrate according to the present invention. Subsequently, the photoresist masking (not shown) is next patterned on the polysilicon layer 130 by using conventional lithography procedure. The polysilicon layer 130 is etched by using the photoresist masking as an etching mask, thereby exposing the oxide layer 120. The etching procedure is finished to form emitter window 140. That is, above step serves as Bipolar Junction Transistor window at the same time, because non-BJT regions masked by doped polysilicon at the same time. The photoresist is then removed.

Figure 4:
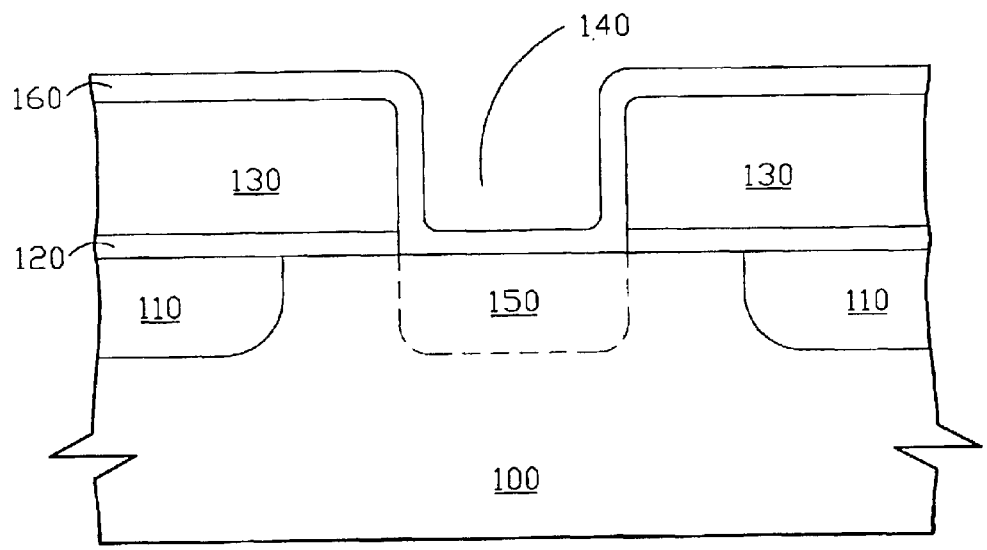
FIG. 4 is the cross sectional view of forming expitaxy base according to the present invention.

Turning to FIG. 4, it shows the cross sectional view of forming an expitaxy base according to the present invention. After the emitter window 140 is formed. A blanket ion implantation is doped into the substrate 100. Therefore, the doped source region 150 is formed below the emitter window 140. The doped source region 150 is the collector region of the Bipolar Junction Transistor. The oxide layer 120 below the emitter window 140 is then removed. In the preferred embodiment, the oxide layer 120 may be removed by HF solution or BOE (buffer oxide etching) solution. Successively, an expitaxy base layer 160 is deposited on the polysilicon layer 130 and the substrate 100 to form base region on the collector region. Furthermore, the expitaxy base layer 160 has an opposite ion type with a collector of the Bipolar Junction Transistor, for example, n-type ion or p-type ion.

Figure 5:
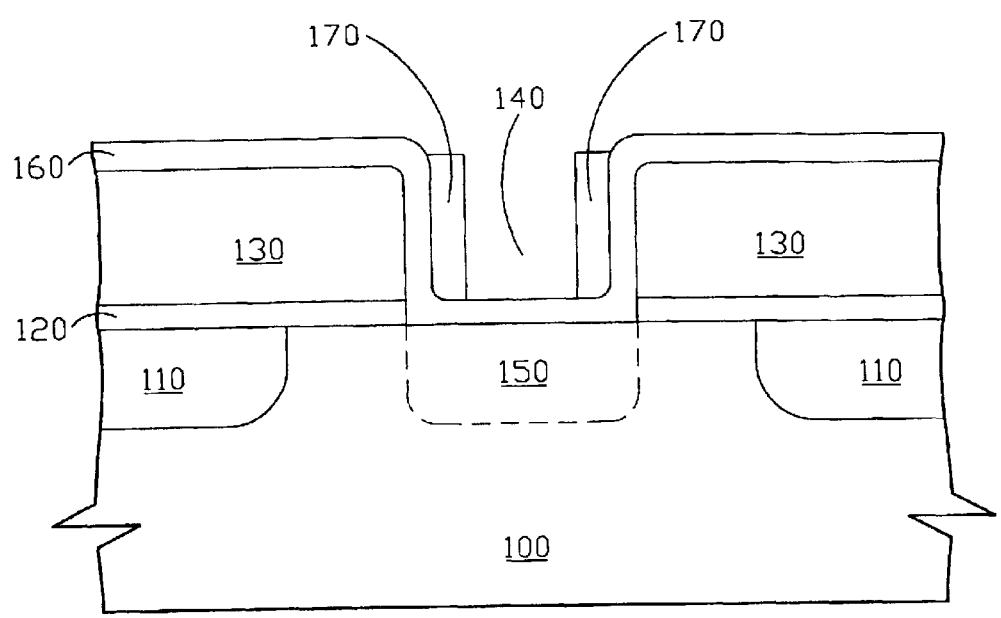
FIG. 5 is the cross sectional view of forming spacer inside the emitter window according to the present invention.

Turning to FIG. 5, it shows the cross sectional view of forming a spacer in the emitter window according to the present invention. After the expitaxy base layer 160 is formed. A dielectric layer is formed on the expitaxy base layer 160. Preferably, the dielectric layer may be composed of oxide or NO (nitride/oxide). The dielectric layer can be formed by using a chemical vapor deposition process. The NO (nitride/oxide) dielectric layer can avoid etching damage issue. The dielectric layer is etched to form inner spacer 170 on the expitaxy base layer 160 sideward inside the emitter window 140. The etching process is performed by the etching back method.

Figure 6:
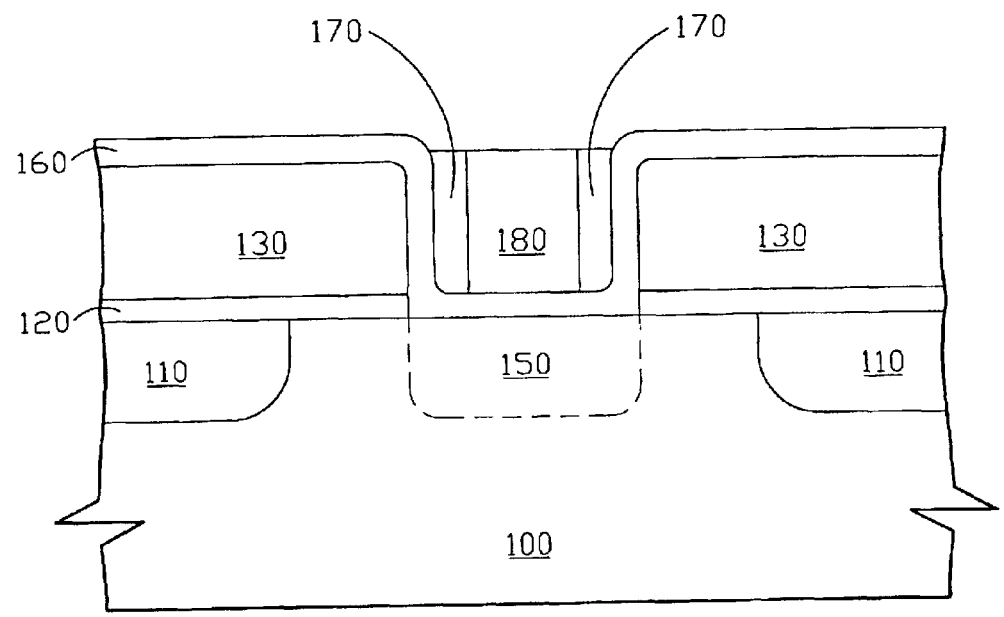
FIG. 6 is the cross sectional view of forming emitter plug according to the present invention.

Turning to FIG. 6, it shows the cross sectional view of forming emitter plug according to the present invention. Then, a deposition process is performed to form polysilicon layer inside the emitter window 140 and on the expitaxy base layer 160.

In the preferred embodiment, the polysilicon or amorphous-Si layer can be performed by two deposition steps. The polysilicon is partly filled into the emitter window 140 in first deposition. Then, the polysilicon is fully filled into the emitter window 140 in second deposition to form the polysilicon layer on the expitaxy base layer 160 and the emitter window 140. The two deposition processes can also be formed by using a chemical vapor deposition process with a SiH4 source. After the deposition processes finishing, a blanket ion implantation with conductive dopants will be doped into the polysilicon respectively. Preferably, the polysilicon layer is formed of in-situ doped polysilicon on the expitaxy base layer 160 and the emitter window 140, because formed in-situ doped polysilicon can reduce the polysilicon layer 130 electric resistance. This conductive material can also be formed by epitaxial growth with insitu doping to deposit poly-Si or amorphous-Si or single crystal Si. Furthermore, the polysilicon layer has as the same type conductive dopants with a collector of the Bipolar Junction Transistor, for example, n-type conductive dopants or p-type to conductive dopants.

Subsequently, the polysilicon layer is etched to form poly plug 180 in the emitter window 140. The etching process is performed by the etching back method, and this etching process may result some thickness loss in expitaxy base ane doped polysilicon outside the emitter window 140. The poly plug 180 is the emitter plug of the Bipolar Junction Transistor. The emitter plug 180 is self-aligned to the emitter window 140, thereby forming a Bipolar Junction Transistor. The collector region, base region, emitter region of the Bipolar Junction Transistor is N/P/N type or P/N/P type.

Figure 8:
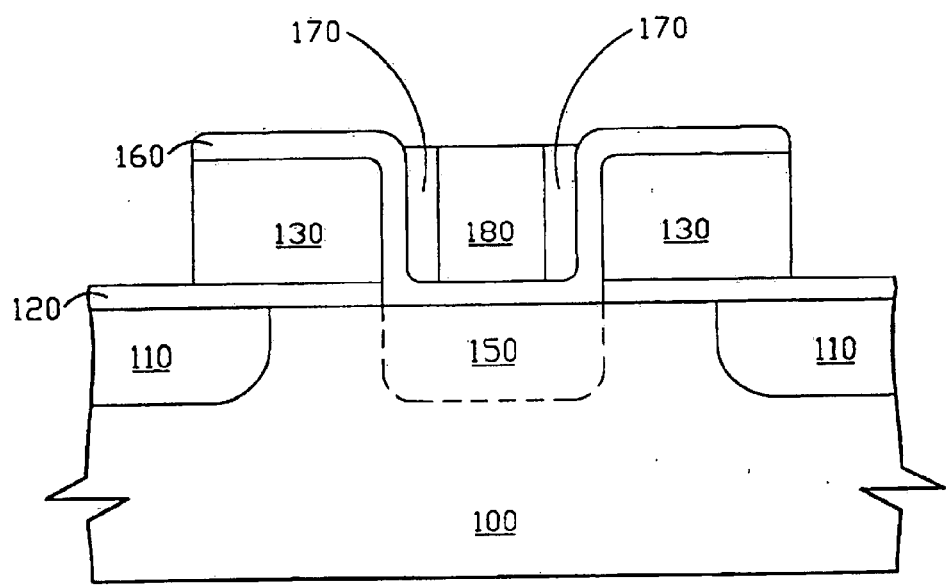
FIG. 8 is the cross sectional view of removing parts of the expitaxy base layer and the first polysilicon layer according to the present invention.

As shown in FIG. 8, a photoresist masking (not shown) is next patterned on the expitaxy base layer 160 by using conventional lithography procedure. The expitaxy base layer 160 and the polysilicon layer 130 are etched using the photoresist masking as an etching mask, thereby removing parts of the expitaxy base layer 160 and the polysilicon layer 130 to form poly base interconnect pattern. The photoresist is then removed.

Figure 7:
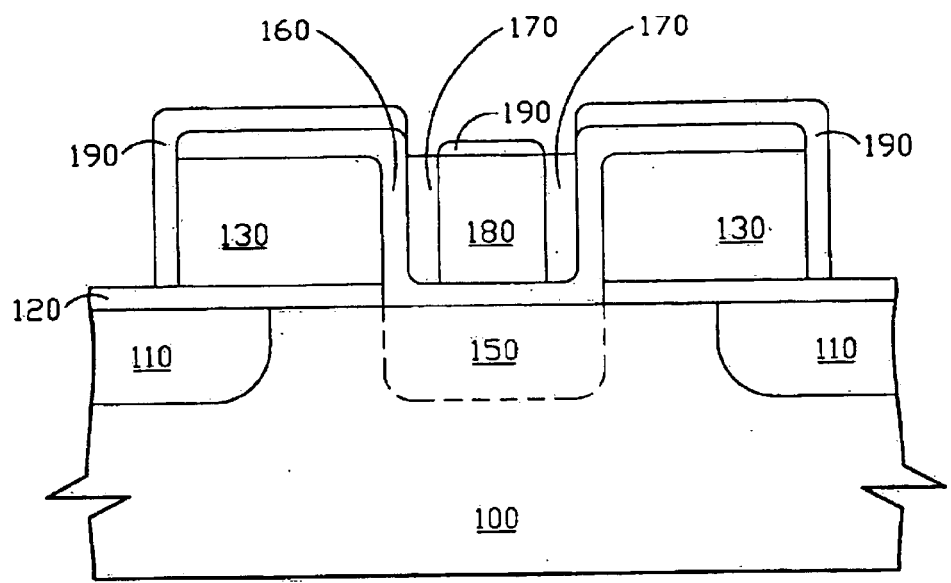
FIG. 7 is the cross sectional view of forming salicide layer according to the present invention.

After the expitaxy base 160 and the polysilicon layer 130 are removed partly, a rapid thermal annealing (RTA) process is performed. The rapid thermal annealing process can make the ions in the doping polysilicon layer diffuse and the oxide layer densificate, thereby refining the quality of the doping polysilicon layer and the oxide layer. Turning to FIG. 7, it shows the cross sectional view of forming salicide layer according to the present invention. After the rapid thermal annealing process, depositing salicide layer is performed. The salicide layer deposition may be performed using other known technique. For example, sputtering a metal on the expitaxy base 160, the inner spacer 170 and the poly plug 180 is performed to form the salicide layer. The sputtered metal includes Ti, Pt, Co, W, Ni, Pd, Cr . . . etc. Turning to FIG. 7, it shows the cross sectional view of forming salicide layer according to the present invention. Finally, the patterned salicide layer 190 is formed on the expitaxy base 160, the poly plug 180 and over the expitaxy base 160, the polysilicon layer 130 by using conventional lithography and etching procedure.

As the above embodiment described, the present invention provides a method for forming a self-aligned Bipolar Junction Transistor with expitaxy base. The advantages of this present invention are the following description. Two masks are saved compared to baseline BiCMOS process using the present invention method; extrinsic base resistance (Rbb') are reduced and easily repeatable, and Rbb' will not depend on expitaxy selectivity on oxide/SiN/poly variation; collector implant self-aligned to emitter can be implanted before expitaxy base deposition, therefore it does not destroy the expitaxy quality and not increase CB (collector/base) junction capacitance; CB junction capacitance will be lower than baseline Bipolar Junction Transistor because obviously reduced CB junction area; one of the most important application of the present invention includes Hetrojunction Bipolar Transistor (HBT) of expitaxy base SiGe.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming a self-aligned Bipolar Junction Transistor with expitaxy base comprising:

forming an oxide layer on a semiconductor substrate;

forming a first polysilicon layer over said oxide layer, said first polysilicon layer comprising a first type ion of a first conductive type;

removing said first polysilicon layer partly to expose said oxide layer, thereby forming an emitter window;

performing a second type ion implantation to form a collector region in said substrate and below said emitter window, wherein said second type ion is of a conductive type opposite to said first type ion;

removing said oxide layer inside said emitter window;

forming an expitaxy base layer over said first polysilicon layer and said semiconductor substrate to form a base region on said collector region, wherein said expitaxy base has said first type ion;

forming a dielectric layer over said expitaxy base;

etching said dielectric layer to form an inner spacer on sidewalls of said expitaxy base inside said emitter window;

forming a second polysilicon layer over said expitaxy base and said emitter window, wherein said second polysilicon layer has second type ion; and etching said second polysilicon layer to form an emitter plug, that is self-aligned to said emitter window.

2. The method of claim 1, wherein said oxide layer thickness is 50~500 angstrom (Å).

3. The method of claim 2, wherein said oxide layer is formed by using chemical vapor deposition (CVD) method.

4. The method of claim 1, wherein said first polysilicon layer thickness is 2000~4000 angstrom (Å).

5. The method of claim 4, wherein said first polysilicon layer is formed by using chemical vapor deposition (CVD) method.

6. The method of claim 1, wherein said first type ion is a P-type ion.

7. The method of claim 1, wherein said first type ion is a N-type ion.

8. The method of claim 1, wherein said second type ion is a P-type ion.

9. The method of claim 1, wherein said second type ion is a N-type ion.

10. The method of claim 1, wherein said expitaxy base comprises in-situ doping polysilicon.

11. The method of claim 1, wherein said dielectric layer comprises oxide formed by using chemical vapor deposition (CVD) method.

12. The method of claim 1, wherein said dielectric layer comprises NO (nitride/oxide) formed by using chemical vapor deposition (CVD) method.

13. The method of claim 1, wherein said second polysilicon comprises in-situ doping polysilicon formed by using chemical vapor deposition (CVD) method.

14. The method of claim 1, wherein said second polysilicon comprises forming a first polysilicon, performing an ion implantation to said first polysilicon, forming a second polysilicon, and performing an ion implantation to said second polysilicon.

15. The method of claim 1, wherein said collector region/base region/emitter region of said Bipolar Junction Transistor is P/N/P type.

16. The method of claim 1, wherein said collector region/base region/emitter region of said Bipolar Junction Transistor is N/P/N type.

17. The method of claim 1, further comprising removing parts of said expitaxy base layer and said first polysilicon layer to form a poly base interconnect pattern after forming said emitter plug.

18. The method of claim 17, further comprising performing a rapid thermal annealing process after removing parts of said expitaxy base layer and said first polysilicon layer.

19. The method of claim 18, further comprising depositing a salicide layer over said expitaxy base layer, said emitter plug and said inner spacer after performing said rapid thermal annealing process.

20. The method of claim 19, further comprising removing parts of said salicide layer to form a patterned salicide layer on said expitaxy base, said emitter plug and over said expitaxy base, said first polysilicon layer after said depositing salicide layer.

21. A bipolar junction transistor with an expitaxy base comprising:

an oxide layer formed on a semiconductor substrate;

a polysilicon layer with a plurality of first type ions of a first conductive type formed over said oxide layer, and an emitter window formed inside said polysilicon layer on said oxide layer;

a collector region formed in said substrate and below said emitter window, wherein said collector region comprises a second type ion, said second type ion being of a conductive type opposite to said first type ion;

an expitaxy base layer formed over said first polysilicon layer and said semiconductor substrate, comprising a base region on said collector region inside said emitter window, wherein said expitaxy base comprises said first type ion;

an inner spacer formed on sidewalls of said expitaxy base layer inside said emitter window;

an emitter plug formed over said expitaxy base layer and said emitter window, wherein said emitter plug has a plurality of said second type ion;

a poly base interconnect pattern formed by removing parts of said expitaxy base layer and said polysilicon layer; and a patterned salicide layer formed on said expitaxy base layer, and said emitter plug, and over said expitaxy base layer and said polysilicon layer.

22. The transistor of claim 21, wherein said oxide layer's thickness is 50~500 angstrom (Å).

23. The transistor of claim 22, wherein said oxide layer is formed using chemical vapor deposition (CVD) method.

24. The transistor of claim 21, wherein said first polysilicon layer has a thickness of 2000~4000 angstrom (Å).

25. The transistor transistor of claim 24, wherein said first polysilicon layer is formed by using chemical vapor deposition (CVD) method.

26. The transistor of claim 21, wherein said first type ion is a P-type ion.

27. The transistor of claim 21, wherein said first type ion is a N-type ion.

28. The transistor of claim 21, wherein said second type ion is a P-type ion.

29. The transistor of claim 21, wherein said second type ion is a N-type ion.

30. The transistor of claim 21, wherein said expitaxy base comprises in-situ doping polysilicon.

31. The transistor of claim 21, wherein said inner spacer is oxide.

32. The transistor of claim 21, wherein said inner spacer is NO (nitride/oxide).

33. The transistor of claim 1, wherein said emitter plug is in-situ doping polysilicon.

34. The transistor of claim 33, wherein said second polysilicon is formed by depositing a polysilicon layer and implanting said polysilicon layer twice.

35. The transistor of claim 21, wherein said collector region/base region/emitter region of said Bipolar Junction Transistor is P/N/P type.

36. The transistor of claim 21, wherein said collector region/base region/emitter region of said Bipolar Junction Transistor is N/P/N type.

* * * * *